United States Patent [19]
Lee et al.

[11] Patent Number: 5,330,925
[45] Date of Patent: Jul. 19, 1994

[54] METHOD FOR MAKING A MOS DEVICE

[75] Inventors: Kwing F. Lee, Red Bank; Ran-Hong Yan, Holmdel, both of N.J.

[73] Assignee: AT&T Bell Laboratories, Murray Hill, N.J.

[21] Appl. No.: 900,625

[22] Filed: Jun. 18, 1992

[51] Int. Cl.$^5$ .......................................... H01L 21/265
[52] U.S. Cl. ....................................... 437/44; 437/41; 437/45; 437/192; 437/200
[58] Field of Search ....................... 437/40, 41, 44, 45, 437/192, 200

[56] References Cited

U.S. PATENT DOCUMENTS

| | | | |
|---|---|---|---|
| 4,532,697 | 8/1985 | Ko | 29/571 |
| 4,577,392 | 3/1986 | Peterson | 437/44 |
| 4,764,477 | 8/1988 | Chang et al. | 437/44 |
| 4,908,326 | 3/1990 | Ma et al. | 437/44 |
| 5,028,554 | 7/1991 | Kita | 437/44 |
| 5,045,486 | 9/1991 | Chittipeddi et al. | 437/41 |
| 5,102,816 | 4/1992 | Manukoda et al. | 437/44 |
| 5,168,672 | 12/1992 | Moslehi | 437/44 |

FOREIGN PATENT DOCUMENTS 0480446 11/1991 European Pat. Off. .

OTHER PUBLICATIONS

G. A. Sai-Halasz et al., "Design and Experimental Technology for 0.1-um Gate-Length Low-Temperature Operation FET's", IEEE Electr. Device Lett. vol. EDL-8, (1987) 463-466.

R. H. Yan, et al., "Scaling the Si metal-oxide-semiconductor field-effect transistor into the 0.1-um regime using vertical doping engineering", *Appl. Phys. Lett.* 59, (1991) 3315-3317.

T. I. Kamins, "Oxidation of Phosphorus-Doped Low Pressure and Atmospheric Pressure CVD Polycrystalline-Silicon Films", J. Electrochem. Soc. 126 (1979) 838-844.

A. C. Adams and C. D. Capio, "The Deposition of Silicon Dioxide Films at Reduced Pressure", *J. Electrochem. Soc. 126,* (1979) 1042-1046.

T. Hori et al., "Gate-Capacitance Characteristics of Deep-Submicron LATID (Large-Angle-Tilt Implanted Drain) MOSFET's", *Int. Elect. Dev. Meeting Tech. Digest,* IEEE (1991) 375-378.

P. J. Tsang et al., "Fabrication of High-Performance LDDFET's with Oxide Sidewall-Spacer Technology", IEEE Trans. on Elect. Dev. ED-29 (1982) 590-596.

*Primary Examiner*—Tom Thomas
*Assistant Examiner*—Kevin M. Picardat
*Attorney, Agent, or Firm*—Martin I. Finston

[57] ABSTRACT

A method for manufacturing an MOS device, such as a PMOS transistor, on a silicon wafer. The method includes steps leading to the formation of a polysilicon gate electrode, and at least one ion-implantation step for forming source and drain junction regions in the silicon wafer. The method further comprises, before the ion-implantation step, the step of forming a first sidewall contactingly disposed adjacent the polysilicon gate electrode. The ion-implantation step is then performed such that the resulting source and drain junction regions are at least partially excluded from that portion of the silicon wafer that directly underlies the polysilicon gate electrode and the sidewall. In preferred embodiments of the invention, a first ion-implantation step is performed after the first sidewall is formed, then a second sidewall is formed adjacent and contiguous with the first sidewall, and then a second ion-implantation step is performed, resulting in the formation of further source and drain junction regions which are at least partially excluded from that portion of the silicon wafer that directly underlies the polysilicon gate electrode and the first and second sidewalls.

14 Claims, 3 Drawing Sheets

METHOD FOR MAKING A MOS DEVICE

FIELD OF THE INVENTION

The invention relates to the fabrication of MOS devices, and more particularly, to the fabrication of p-channel devices which have gate lengths smaller than 1 µm.

ART BACKGROUND

Until recently, improvements in the density of FET integrated circuits were achieved primarily by scaling down the device dimensions. However, as gate lengths are reduced to 0.5 µm or less, new, short-channel effects emerge, which are detrimental to the performance of scaled-down devices. In one approach to the mitigation of short-channel effects, dual implantation steps are used to tailor the source and drain regions. In, e.g., an n-channel device, a low-energy arsenic or antimony implant forms a shallow junction near the intrinsic device region. A subsequent, higher-energy implant forms deep junctions in the extrinsic region, to facilitate the source and drain contacts. Such an approach is described in G. A. SaiHalasz, et al., "Design and Experimental Technology for 0.1-µm Gate-Length Low-Temperature Operation FET's", *IEEE Electr. Device Lett.* Vol. EDL-8 (1987) 463–466. Reported therein is the use of a sidewall, typically an oxide sidewall, to delineate the shallow and deep junction regions in a self-aligned manner.

Although such an approach has shown promising results in connection with NMOS fabrication, it may not provide an adequate solution in the context of PMOS fabrication. That is, shallow boron-doped junctions (as required in the analogous PMOS context) are difficult to form, requiring, e.g., careful preamorphization of the implanted substrate material. An alternative approach, referred to as "vertical doping engineering", may relax the requirement of shallow junctions. Such an approach is described, e.g., in R. H. Yan, et al., "Scaling the Si metal-oxide-semiconductor field-effect transistor into the 0.1-µm regime using vertical doping engineering", *Appl. Phys. Lett.* 59 (1991) 3315–3317. According to the technique of vertical doping engineering, the intrinsic device region has a pulse-shaped doping profile, resulting in a buried layer of relatively high doping density. However, lateral diffusion of boron during post-implant anneal may be deleterious in vertically engineered devices, as well as in other devices having a junction depth roughly the same as, or larger than, the channel length. That is, laterally diffusing boron atoms will tend to encroach into the channel region by a distance which is typically about 70% of the junction depth. This can create an unacceptable amount of parasitic capacitance due to source-drain overlap.

Practitioners have attempted to reduce source-drain overlap capacitance in various ways. For example, U.S. Pat. No. 4,532,697, issued to P. K. Ko on Aug. 6, 1985, describes the in situ growth of an oxide layer up to 0.15 µm thick on the sides of a polysilicon gate mesa by differential oxidation. After the oxide layer is grown, shallow source and drain junctions are formed by implantation of, e.g., arsenic. The oxide layer offsets the implanted regions from the gate mesa, resulting in reduced overlap capacitance.

However, the wafer during in situ oxidation is subjected to relatively high temperatures for relatively long time intervals, typically 850° C. or more for 20 minutes or more for steam oxidation, and 950° C. or more for 30 minutes or more for dry oxidation. (See, e.g., T. I. Kamins, "Oxidation of Phosphorus-Doped Low Pressure and Atmospheric Pressure CVD Polycrystalline-Silicon Films", *J. Electrochem. Soc.* 126 (1979) 838–844.) The channel region of the device being manufactured generally needs to be doped before this oxide layer is formed. As a consequence, this thermal cycle may cause an unacceptable amount of diffusion of dopant species out of the channel region to which they were initially confined. This tendency is particularly disadvantageous in the manufacture of devices having gate lengths of 0.5 µm or less.

The differential oxidation method suffers a further disadvantage because it relies upon the differing oxidation rates exhibited by silicon regions that have substantially different doping levels. An extra doping step is required, to assure that the doping of the polysilicon gate mesa is distinct from the doping of the intended source and drain regions. The extra doping step is disadvantageous because it incurs extra manufacturing cost.

Thus, practitioners have hitherto failed to provide a generally applicable technique for mitigating the parasitic capacitance that arises when source and drain dopant species diffuse toward the device intrinsic region.

SUMMARY OF THE INVENTION

We have developed a new sidewall technique for fabricating MOS devices. In devices made by our technique, diffusion of a dopant species such as boron from the deep junction regions causes relatively little gate encroachment, relative to earlier techniques. As a result, standard ion implantation methods can be used to fabricate devices, such as p-channel devices, which have gate lengths less than 0.5 µm, and even as small as 0.15 µm or less.

In those techniques of the prior art that include dual implantation steps, shallow junctions are first formed, a sidewall is formed after the shallow implant, and then deep junctions are formed by an implant which is masked by the sidewall.

In our technique, by contrast, a first sidewall is formed before, rather than after, the shallow implantation step. In a preferred embodiment of our invention, a second sidewall is additionally formed after the shallow implantation step. The sidewalls are preferably conformally deposited by low-pressure chemical vapor deposition (LPCVD). The sidewalls are typically composed of silicon dioxide, although other dielectric materials which can be conformally deposited can also be used. Examples of such alternative materials are silicon nitride and undoped polysilicon.

The first sidewall of our technique is generally more than 200 Å thick, and more typically about 500 Å thick. The first sidewall thickness is also generally more than 10% of the gate length, and more typically, 50% of the gate length or more. This sidewall is distinct from the protective oxide coating, typically only about 60 Å thick, that is conventionally formed on the polysilicon gate of at least some MOS transistors before source and drain junctions are formed by ion implantation.

Because the shallow junction implant is masked by the first sidewall, the resulting shallow junctions are set off from the intrinsic device region by a distance which is comparable to the distance through which the implanted species will laterally diffuse toward the intrinsic region. This results in improved properties, such as reduced parasitic capacitance, relative to devices of the prior art.

Accordingly, the invention in one embodiment involves a method for manufacturing at least one MOS device (which may, e.g., be a PMOS device to be incorporated in a CMOS integrated circuit) by, inter alia, processing a silicon wafer having a principal surface. The method includes the steps of forming a polysilicon layer overlying the principal surface, forming a silicon nitride layer overlying the polysilicon layer, patterning the nitride layer, and patterning the polysilicon layer such that at least one polysilicon gate electrode is formed, said electrode overlain by a silicon nitride cap region. The method includes the further steps of conformally depositing a first dielectric sidewall layer, patterning the first sidewall layer to form a first sidewall contactingly disposed adjacent the electrode and cap region, and implanting the principal surface with a first ionic flux (comprising, e.g., boron if the device being made is a PMOS device), such that a first junction (referred to below as a "shallow junction") is formed in the silicon wafer, but is at least partially excluded from the region directly underlying the electrode and the first sidewall.

In a preferred embodiment, the method includes the further steps of conformally depositing a second dielectric sidewall layer, patterning the second sidewall layer to form a second sidewall contiguous with the first sidewall, and implanting the principal surface with a second ionic flux (comprising, e.g., boron if the device being made is a PMOS device), such that a second junction (referred to below as a "deep junction") is formed in the silicon wafer, but is at least partially excluded from the regions directly underlying the first and second sidewalls.

BRIEF DESCRIPTION OF THE DRAWINGS

FIG. 1 depicts a substrate portion which has been prepared for the formation of MOS gate structures by depositing thereupon, in sequence, a gate oxide layer, a polysilicon layer, and a silicon nitride layer.

FIG. 2 depicts the substrate portion of FIG. 1 after patterning of the nitride layer and subsequent deposition of an LPCVD silicon dioxide layer.

FIG. 3 depicts the substrate portion of FIG. 2 after patterning of the LPCVD silicon dioxide layer.

FIG. 4 depicts the substrate portion of FIG. 3 after patterning of the polysilicon layer and subsequent deposition of a conformal, LPCVD silicon dioxide film.

FIG. 5 depicts the substrate portion of FIG. 4 after etching of the conformal film to form the first sidewall, and subsequent shallow ion implantation.

FIG. 6 depicts the substrate portion of FIG. 5 after formation of the second sidewall and subsequent deep ion implantation.

DETAILED DESCRIPTION

Figure 1:
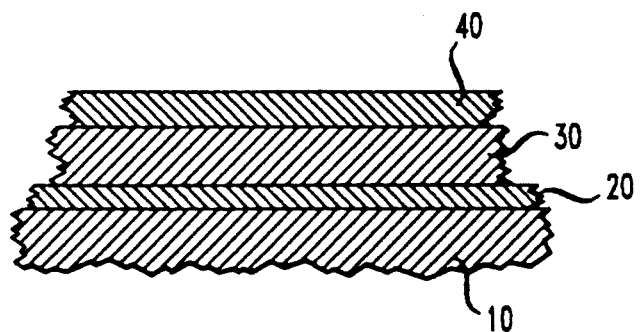
FIGS. 1-6 are schematic, cross-sectional views of a portion of a substrate in various stages of the formation of an MOS device according to one embodiment of the invention.
Figure 2:
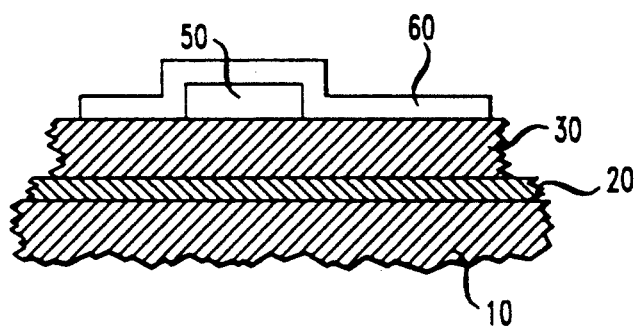
Figure 3:
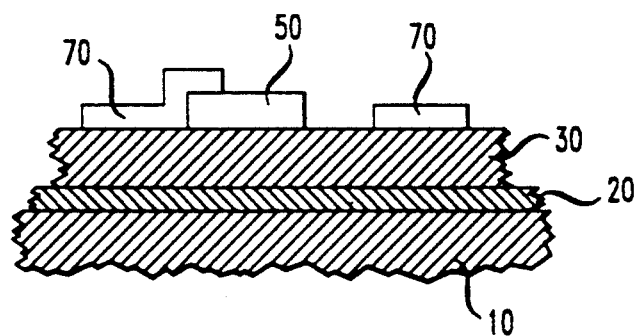

A preferred embodiment of the invention is now described with reference to FIGS. 1-6. Starting material is first provided in the form of a 1-3 $\Omega$-cm, n-type, silicon wafer 10. A patterned field oxide layer is formed by conventional LOCOS processing. Then, electron-beam alignment markers are defined by etching trenches through the field oxide and into the substrate. We have found that an etch depth of 0.8 $\mu$m offers enough contrast to serve as a fiducial marker for the electron-beam lithographic tool. Etched trenches are a desirable substitute for heavy metal silicide markers, because silicides may, inter alia, tend to increase leakage current in the completed device.

A vertically-engineered doping structure is formed by an arsenic implant of $10^{13}$ cm$^{-2}$ at 100 keV. A gate oxide layer 20 of 4 nm thickness is then grown at 800° C. in dry oxygen. The gate oxide layer is patterned to define transistors having gate lengths in the range 0.15 $\mu$m-1.1 $\mu$m, using, e.g., Shipley negative resist SAL-603, and a JEOL 5DII electron-beam system. Other features on the gate level, such as gate contact pads and large area gate testers, as well as all other levels, are defined by, e.g., Nikon g-line lithography.

The gate level definition sequence is now described. An undoped polysilicon layer 30, 200 nm in thickness, is deposited on gate oxide 20. A silicon nitride film 40 of thickness 100 nm is deposited on the polysilicon. Nitride masks 50 for defining small gate features are made by patterning the nitride film, using electron-beam lithography. An optional layer 60 of silicon dioxide, 40 nm thick, may be deposited by low-pressure chemical vapor deposition (LPCVD) from, e.g., tetraethyl orthosilicate (TEOS). Such a layer is hereafter referred to as a "TEOS layer" or "TEOS film". (Of course other silicon-containing precursor materials, such as tetramethyl cyclotetrasiloxane, may also be used.) Significantly, high-quality films are readily deposited by LPCVD from precursors such as TEOS at temperatures of 700° C.-750° C. and deposition rates of 200-300 Å/min., and deposition at still lower temperatures is possible. (See, e.g., A. C. Adams and C. D. Capio, "The Deposition of Silicon Dioxide Films at Reduced Pressure", J. Electrochem. Soc. 126 (1979) 1042-1046.)

Figure 4:
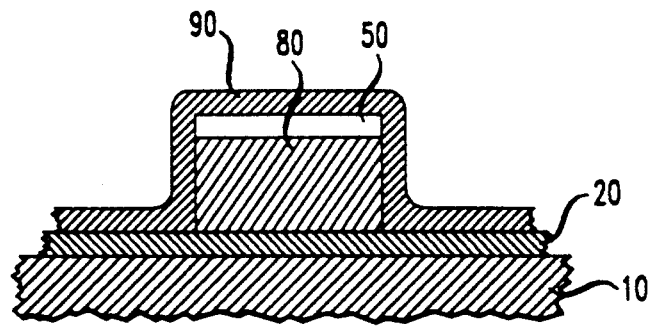

In order to make masks 70 for defining large gate features, the TEOS layer, if used, is patterned by optical lithography and subjected to wet etching. (The nitride masks 50 are resistant to the wet oxide etch.) With reference to FIG. 4, the polysilicon features 80 are then formed by reactive ion etching (RIE), masked by nitride masks 50 and optional TEOS masks 70. The patterned TEOS layer is removed after this RIE step.

An oxide layer (not shown) is then grown on the sides and on the tops (if exposed) of polysilicon features 80 by thermal oxidation. This layer is typically about 60 Å thick. Growth is typically performed at 800° C. for 18 minutes in dry oxygen. The purpose of this oxide layer is primarily to protect the polysilicon features.

Figure 5:
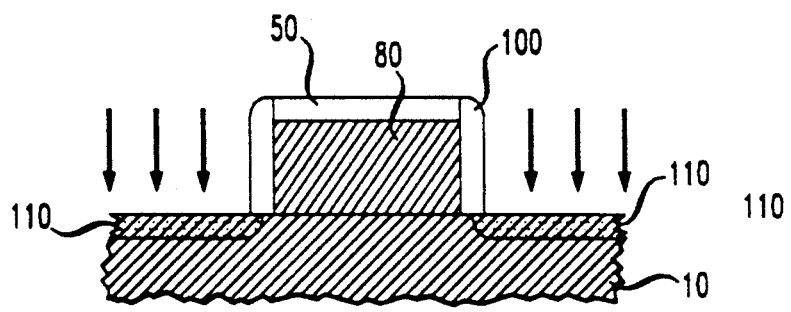

The first sidewall is then formed, as illustrated in FIGS. 4 and 5. A conformal dielectric film 90, approximately 50 nm in thickness is first deposited. This film is preferably a silicon dioxide film deposited from TEOS by LPCVD. The first sidewall 100 is defined by reactive ion etching of film 90 according to conventional methods. Shallow source and drain junctions 110 are then formed by a BF$_2$ implant at an exemplary flux of $10^{15}$ cm$^{-2}$ at an exemplary energy of 10 keV. The shallow implant is masked by first sidewall 100 and by the polysilicon gate 80 which overlies the channel region, such that the as-implanted species are substantially excluded from the channel region.

Figure 6:
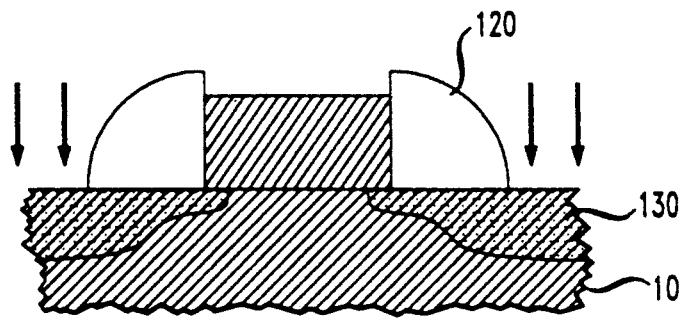

The second sidewall 120 is then formed, as illustrated in FIG. 6. To form the second sidewall, a 200-nm TEOS film is deposited without removing the first sidewall. The second sidewall is etched by RIE, such that a total sidewall is left bounding the polysilicon gate electrode and having greater lateral extent than the first sidewall, alone. Nitride mask 50, which caps polysilicon gate 80, is then removed by a wet etch. Deep source and drain junctions 130 are then formed by a $BF_2$ implant at an exemplary flux of $5 \times 10^{15}$ cm$^{-2}$ at an exemplary energy of 10 keV. The deep implant is masked by the first and second sidewalls and the polysilicon gate such that the as-implanted species are excluded from the intrinsic device region and at least partially excluded from the region under the first sidewall. We have found that in order to minimize boron channeling effects, it is preferable to use $BF_2$ as the boron-containing material for implantation. (It should be noted that although the first and second implants are respectively referred to herein as the "shallow" and "deep" implants, they will actually be of about the same depth in at least some classes of devices.)

After the two junction implants, drive-in of the implanted species is performed by rapid thermal annealing (RTA), exemplarily at 1050° C. for 10 seconds in nitrogen, followed by furnace annealing at 800° C. for 20 minutes in nitrogen. We observed no change in the threshold voltage attributable to the furnace anneal.

EXAMPLE

An exemplary, p-channel MOSFET having a channel length of 0.15 μm and an effective channel width of 9.5 μm was made substantially as described above. We determined that the shallow junctions were about 90 nm deep. We measured a gate overlap capacitance of 0.2 fF/μm. It should be noted that such a capacitance value compares favorably with values obtained from arsenic-doped shallow junctions in n-channel devices.

Figure 7:
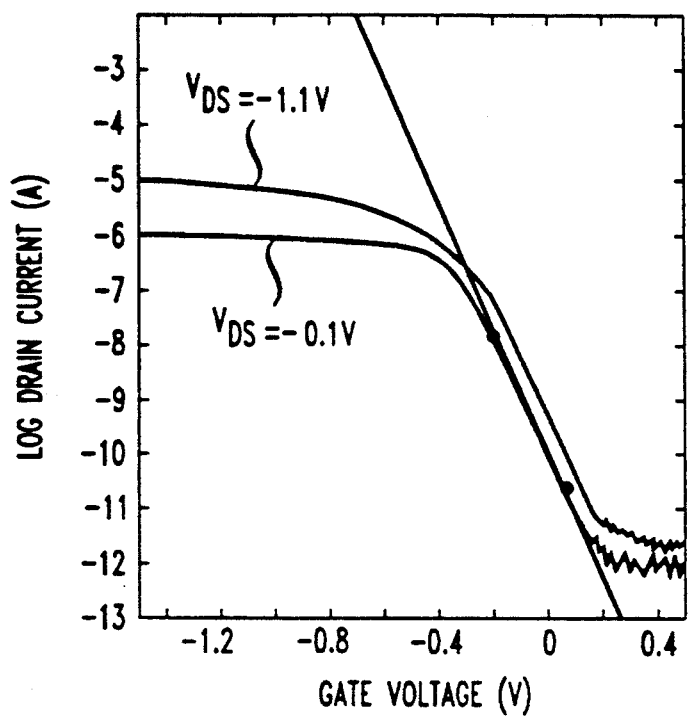
FIG. 7 is a graph of the subthreshold characteristics of an exemplary transistor made according to the invention.

Subthreshold characteristics of the exemplary transistor are shown in FIG. 7 for two different values of the drain-to-source voltage $V_{DS}$. The gate length was calibrated by comparing with similarly written electron-beam gate structures of known dimensions. A subthreshold slope of 90 mV/decade and a threshold voltage of −0.3 V were obtained.

Drain-induced barrier lowering was effectively suppressed by the use of vertical doping engineering, effectuated by the 100-keV arsenic implant. Because the arsenic is implanted relatively far from the surface and diffuses relatively slowly, surface doping remains relatively low after the processing sequence is completed. We attribute the relatively low threshold voltage to the low surface doping. The combination of subthreshold slope and threshold voltage which we measured represents the best room-temperature results reported, up to the present time, for p-channel devices of this dimension.

We measured a source-drain junction capacitance of 0.5 fFμm$^{-2}$. This represents, roughly, a factor-of-5 improvement over conventionally scaled devices.

Figure 8:
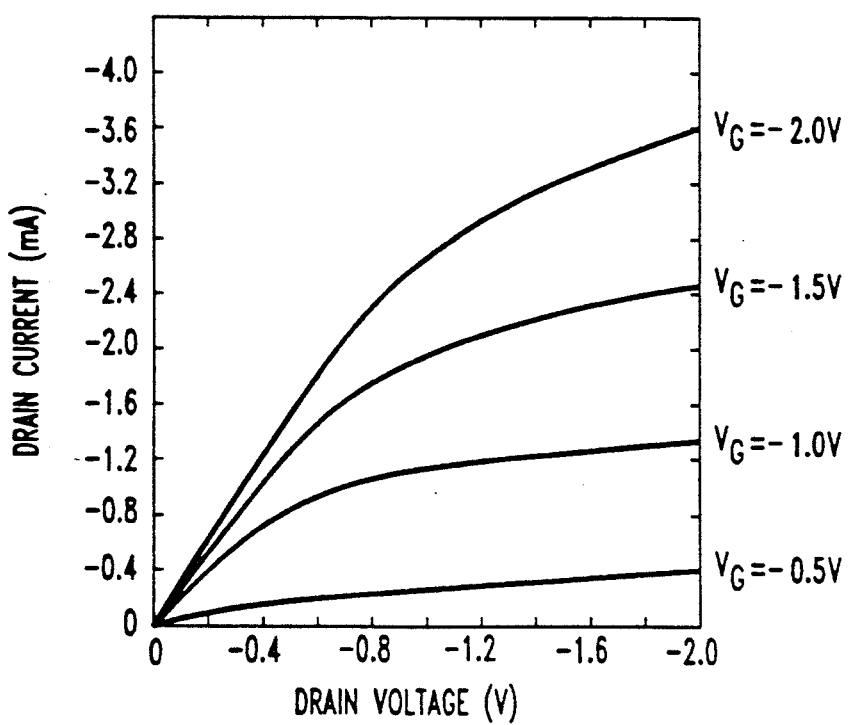
FIG. 8 is a graph of the drain characteristics of an exemplary transistor made according to the invention.

Shown in FIG. 8 is a graph of the drain characteristics of an exemplary transistor selected for good current drive. (Different transistors are represented by FIGS. 7 and 8, respectively.) Four values of the gate-to-source voltage $V_G$ are represented on the graph. The selected transistor had a channel length of 0.22 μm and an effective channel width of 9.5 μm. For the selected transistor, we measured a transconductance $g_m$ of 220 mS/mm.

We claim:

1. A method for manufacturing at least one MOS device, comprising the steps of:
   a) providing a silicon wafer which has a principal surface;
   b) forming a polysilicon layer which overlies the principal surface;
   c) forming a layer, overlying the polysilicon layer, which is resistant to at least certain polysilicon etchants;
   d) patterning the etch-resistant layer;
   e) patterning the polysilicon layer such that at least one polysilicon gate electrode is formed, said electrode overlain by a cap portion of the etch-resistant layer, and
   f) implanting the principal surface with a first ionic flux such that first source and drain junction region are formed in the silicon wafer, CHARACTERIZED IN THAT
   g) the method further comprises, before the implanting step, the steps of:
   conformally depositing by low pressure chemical vapor deposition, a first dielectric sidewall layer which overlies the patterned polysilicon layer and at least a portion of the principal surface, and which has a thickness greater than 200 Å as measured laterally relative to the principal surface; and patterning the first sidewall layer such that a first sidewall is formed, the first sidewall contactingly disposed adjacent the polysilicon gate electrode, and
   h) the implanting step is performed such that the first source and drain junction regions are at least partially excluded from that portion of the silicon wafer that directly underlies the polysilicon gate electrode and the first sidewall.

2. The method of claim 1, further comprising, after the implanting step, the steps of:
   a) conformally depositing a second dielectric sidewall layer which overlies at least a portion of the principal surface;
   b) patterning the second sidewall layer such that a second sidewall is formed adjacent and contiguous with the first sidewall; and
   c) implanting the principal surface with a second ionic flux such that second source and drain junction regions are formed in the silicon wafer, said implantation performed such that the second source and drain junction regions are at least partially excluded from that portion of the silicon wafer that directly underlies the polysilicon gate electrode and the first and second sidewalls.

3. The method of claim 2, further comprising, before the step of implanting with the second ionic flux, the step of removing the etch-resistant cap portion.

4. The method of claim 1, wherein the MOS device is a PMOS device, and the implanting step results in boron doping of the first source and drain junction regions.

5. The method of claim 2, wherein the first and second ionic fluxes comprise ions of boron or a boron compound.

6. The method of claim 1, wherein a gate length is associated with the polysilicon gate electrode, and the thickness of the first sidewall, as measured laterally relative to the principal surface, is greater than 10% of the gate length.

7. The method of claim 1, wherein a gate length is associated with the polysilicon gate electrode, and the thickness of the first sidewall, as measured laterally relative to the principal surface, is at least about 50% of the gate length.

8. The method of claim 4, further comprising, after the implanting step, the step of annealing the silicon wafer, wherein:
a) the annealing step results in the diffusion of boron in the first source and drain junction regions to a characteristic junction depth;
b) a gate length is associated with the polysilicon gate electrode, and
c) the thickness of the first sidewall, as measured laterally relative to the principal surface, is at least about 50% of the junction depth.

9. The method of claim 1, wherein a gate length is associated with the polysilicon gate electrode, and the gate length is about 0.5 $\mu$m or less.

10. The method of claim 1, wherein a gate length is associated with the polysilicon gate electrode, and the gate length is about 0.15 $\mu$m or less.

11. The method of claim 1, wherein the first sidewall comprises silicon dioxide which is conformally deposited by low-pressure chemical vapor deposition.

12. The method of claim 2, wherein the first and second sidewalls comprise silicon dioxide which is conformally deposited by low-pressure chemical vapor deposition.

13. The method of claim 1, wherein the etch-resistant layer comprises silicon nitride, the step of patterning the etch-resistant layer is performed such that at least one silicon nitride mask is created; and the step of patterning the polysilicon layer comprises performing reactive ion etching through the silicon nitride mask.

14. The method of claim 13, further comprising, before the implanting step, the steps of forming, by LPCVD, a silicon dioxide layer overlying at least a portion of the principal surface, and patterning the LPCVD layer such that at least one silicon dioxide mask is created; and wherein the step of patterning the polysilicon layer comprises performing reactive ion etching through the silicon nitride and silicon dioxide masks.

* * * * *